United States Patent [19]

Kirjavainen

[11] Patent Number: 4,739,210

[45] Date of Patent: Apr. 19, 1988

[54] METHOD AND A DEVICE FOR GENERATING HEAT ENERGY AND OSCILLATION ENERGY

[75] Inventor: Kari Kirjavainen, Espoo, Finland

[73] Assignee: OY Nokia AB, Helsinki, Finland

[21] Appl. No.: 904,704

[22] Filed: Sep. 8, 1986

[51] Int. Cl.[4] .......... H01L 41/08

[52] U.S. Cl. .......... 310/311; 310/314; 310/323; 72/253.1; 72/286; 156/47; 156/51; 164/48; 164/501; 219/221; 425/113; 425/325

[58] Field of Search .......... 310/311, 314, 316, 317, 310/321, 323, 328, 334, 335, 322, 325, 26; 219/6.5, 7.5, 201, 221, 209, 210, 243; 72/253.1, 286; 140/71 R; 148/2, 12.9, 13; 164/462, 463, 471, 478, 48, 492, 493, 501, 71.1; 29/745; 156/47, 52, 51; 30/140; 366/144, 146; 425/113, 325, DIG. 13, DIG. 16, DIG. 39, DIG. 243, DIG. 245

[56] References Cited

U.S. PATENT DOCUMENTS

| | | | |
|---|---|---|---|
| 2,101,272 | 12/1937 | Scott | 310/328 X |
| 3,131,515 | 5/1964 | Mason | 310/323 X |
| 3,148,289 | 9/1964 | Pijls et al. | 310/328 |
| 3,351,393 | 11/1967 | Emmerich | 310/328 X |
| 3,452,273 | 6/1969 | Foster | 310/323 X |
| 4,443,731 | 4/1984 | Butler et al. | 310/328 X |

*Primary Examiner*—Mark O. Budd

*Attorney, Agent, or Firm*—Lowe, Price, Leblanc, Becker & Shur

[57] ABSTRACT

The invention relates to a method of and a device for simultaneously generating heat energy and oscillation energy. In the method heat is generated by induction heating and oscillations are created by means of at least piezoelectric elements. Previously a resonance circuit formed by a series connection of an inductive component and a capacitive, piezoelectric component has been used for the generation of oscillations only. A disadvantage of this kind of circuit has been that the circuit is difficult to control on account of the narrow resonance region of the piezoelectric element. This advantage is avoided in the solution according to the invention in such manner that one and the same resonance circuit formed by a series connection of an inductive and capacitive element generates both heat energy and oscillation energy.

7 Claims, 1 Drawing Sheet

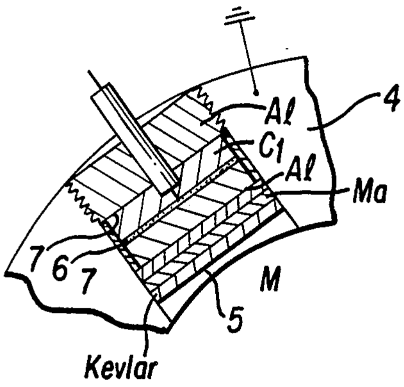
FIG. 1b
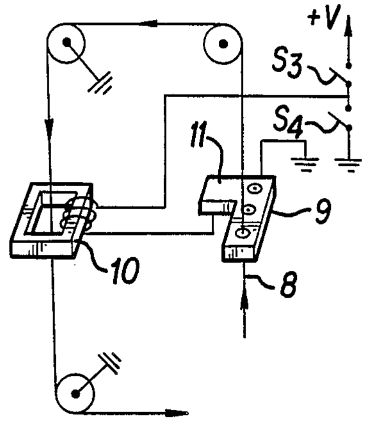
FIG. 2
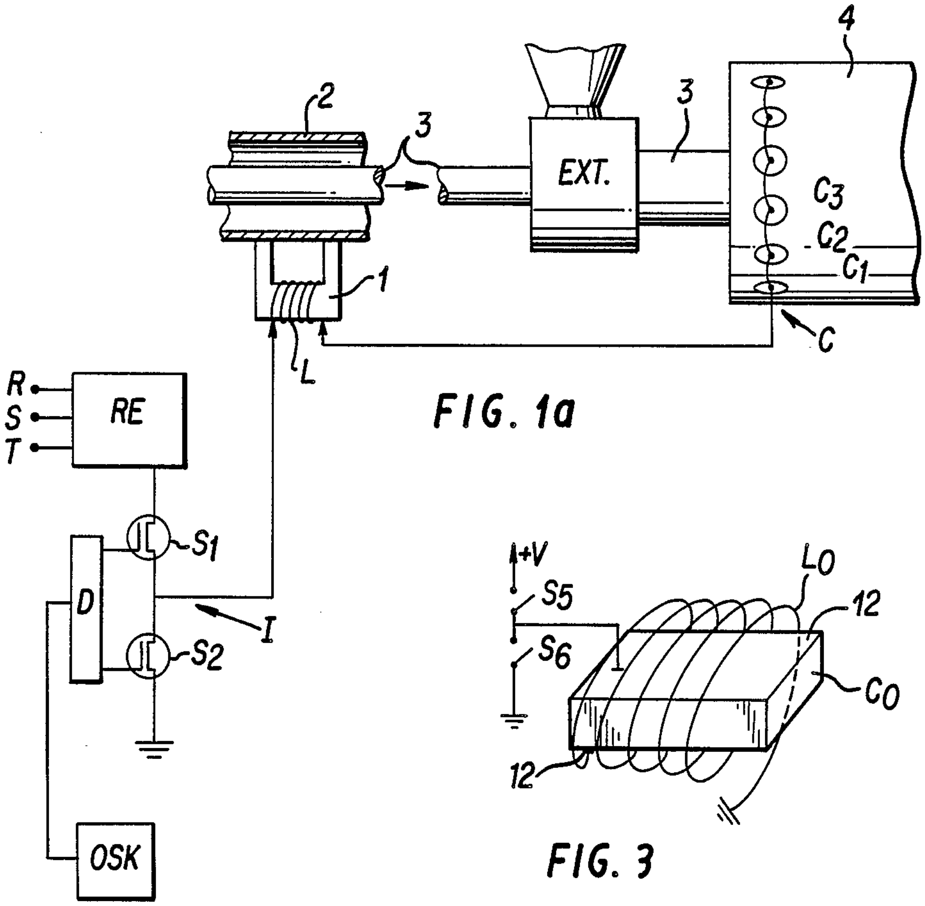
FIG. 1a
FIG. 3

METHOD AND A DEVICE FOR GENERATING HEAT ENERGY AND OSCILLATION ENERGY

BACKGROUND OF THE INVENTION

The invention relates to a method and a device for simultaneously generating heat energy and oscillation energy. In the method heat is generated preferably by means of inducation heating, and oscillations are created by means of at least piezoelectric elements.

In a known induction heating method a body to be heated is positioned within an alternating-current coil, whereby the body is warmed up by eddy currents created in said body. A device in which an object to be heated forms a short-circuited secondary circuit of a transformer can also be included in the sphere of induction heating.

Inductions heating is usually carried out by means of a resonance circuit formed by a series connection of an inductive and a capacitive element, in which resonance circuit the inductive element (a coil) is used for the actual heating and the capacitive element (a capacitor) influences only the resonance frequency of the oscillation circuit. Inverters effected by semi-conductors, for instance, can be used as power sources in the induction heaters.

DISCLOSURE OF THE INVENTION

According to the invention it has now been found out that the capacitive element of a series resonance circuit used for induction heating can be carried out in a piezoelectrical form, whereby it is possible to generate mechanical oscillations by means of the circuit in connection with heating. In its simplest form, the device according to the invention is thus formed by a series connection of a heating coil and a piezoelectric capacitor, which connection is controlled at one end e.g. by an inverter and the other end of which is grounded.

Previously a resonance circuit formed by a series connection of an inductive and a capacitive component, the capacitive component being piezoelectric, has been used for generating oscillations to some extent. A disadvantage of this type of circuit, however, has been that the resonance region of a piezoelectric component is very narrow, whereby it has been very difficult to adjust the control frequency within this narrow frequency peak. Therefore is has not, either, been presumable in advance that the capacitive component of a series resonance circuit (LC-circuit) used for induction heating could be effected in a piezoelectrical form. However, it has now been discovered that the additional losses caused by the heating bring about widening of the resonance region, whereby the circuit is considerably easier to control, since the control frequency can be adjusted more easily.

Practical tests show that the width of the resonance region is increased about tenfold. As the control of the resonance circuit gets easier, the oscillation can be intensified by the use of a magnetostrictive core in the heating coil, whereby the oscillation of the magnetostrictive core intensifies the effect of the piezoelectric element. In one embodiment of the invention, magnetostrictive properties have been attached to a capacitive piezoelectric element so that the coil can be wound around the capacitive element. So the method and the device according to the invention are characterized by the features described in claims 1 to 7.

By means of the solution according to the invention, oscillation energy, too, is obtained in connection with the heating by means of a simple apparatus, and it has been discovered that the solution has several advantageous applications. The device can be used e.g. for the vulcanization of preheating of cables. The preheating of metal conductors is thereby carried out by induction heating by means of the coil of a series resonance circuit and the vulcanization of the insulator material is carried out utilizing the oscillation of the capacitive element of the circuit. Another advantageous application of the device and the method according to the invention is a combined drawing and annealing device for cables, in which a conductor is annealed in an induction furnace and the friction caused by the drawing stones is reduced by means of the oscillation. Still another advantageous application is an extrusion device wherein a material can be heated in such a manner that the eddy currents caused by the coils heat up the metal components of the extrusion device and an oscillation is created by means of the piezoelectric components of the resonance circuit and optionally by means of the magnetostrictive core of the coil, which oscillation is absorbed in the extrusion material. These factors together bring about the heating and the plasticization of the material.

A BRIEF DESCRIPTION OF THE DRAWINGS

The invention will be described more closely below with reference to the attached drawing, wherein FIGS. 1*a* and 1*b* illustrate the soluction according to the invention when applied to the preheating and vulcanizing of cables, FIG. 2 illustrates the solution according to the invention when applied to a drawing and annealing device for cables, and FIG. 3 illustrates a solution wherein the capacitive element is both piezoelectric and magnetostrictive.

A DETAILED DESCRIPTION OF THE INVENTION

In the figures the different components are not shown on the same scale with respect to each other, but their relative sizes have been changed for the sake of clarity. In FIG. 1*a* the resonance circuit is formed by a series connection of a heating coil L and a piezoelectric element C. In the figure the element C is formed by the sum of a plurality of parallel components $C_1$, $C_2$, etc. A counter electrode (not shown in FIG. 1*a*) of the piezoelectric capacitor components $C_1$ is grounded. It is to be understood that the circuit can comprise e.g. a plurality of coils connected in series and capacitive components connected in parallel; however, it is essential that the circuit forms a series-connected LC-circuit. In the figure the coil L is wound around a ferrite core 1 which is fastened on a teflon pipe 2, a naked metal conductor 3 moving in said pipe. The LC-circuit is controlled by an inverter connection I which is formed by a rectifying element RE for the mains voltage, FET-transistors $S_1$ and $S_2$ acting as switches, and an oscillator OSK and a control circuit D of said transistors $S_1$ and $S_2$. The transistors $S_1$ and $S_2$, which act as switches, are controlled by the oscillator and the control circuit D so that they are alternately opened and closed. The switching frequency is typically about 400 kHz. When the conductor 3 is passed on in the pipe 2 in the direction of the arrow, it is warmed by the eddy currents caused therein by the coil L. The preheated naked metal conductor 3 is thereafter passed into an extrusion device EXT in which it is coated with an insulating material which is further vulcanized in a cylindrical vulcanizing pipe 4. The conductor moves along the central axis of the vulcanizing pipe 4, the capacitive components of the LC-circuit being arranged in the pipe over the whole length of the circular periphery thereof (the components $C_1$ to $C_3$ being shown in FIG. 1*a*). The oscillation of the piezoelectric components is focused on the insulating material of the conductor 3 by means of a liquid which acts as a medium in the vulcanizing pipe 4. FIG. 1*b* illustrates more closely the positioning of one piezoelectric component $C_1$ in the vulcanizing pipe of steel. A window 5 is provided on the inner surface of the pipe, through which window the oscillation is transmitted to the medium M of the pipe. The piezoelectric component $C_1$ is, in the example of the figure, formed by two superposed piezoceramic rings, to the intermediate electrode 6 of which a voltage is applied. Counter electrodes 7 are connected to the grounded steel pipe 4 through aluminium rings A. The upper aluminium ring A1 is fastened on the pipe 4 by a threaded coupling. Matching of the acoustic impedance from the piezoceramic elements to the fluid medium M is carried out by means of successive layers of aluminium, magnesium and kevlar.

FIG. 2 shows another advantageous application of the invention in a drawing and annealing device for cables. In the figure a conductor 8 moves in the direction indicated by the arrow, and it is drawn through a stone rack 9 so that the cross-sectional area thereof becomes as desired. The conductor material hardens in the stone rack and is again softened in an induction furnace 10. The piezoceramic elements 11 are fastened to the stone rack 9, and one electrode of said elements is connected to the coil and the other is grounded, whereby the elements 11 form a series resonance circuit together with the coils of the induction furnace. The inverter, which controls the circuit and which is connected to one terminal of the coil, is shown in the figure merely by means of switches $S_3$ and $S_4$ for the sake of clarity. The control frequency of the inverter is typically about 500 kHz. The friction caused by the drawing stones is reduced by means of the oscillation of the piezoelectric elements 11; in practice, the friction reduction obtained is about 30 to 50 percent. As stated above, the oscillation of the piezoelectric components can be intensified, if required and depending on the application, by providing the heating coil with a magnetostrictive core. FIG. 3 illustrates one preferred embodiment of the device according to the invention, in which embodiment a capacitive element $C_0$ is of a piezoceramic magnetostrictive material, and a heating coil $L_0$ is wound around said element. Metal electrodes 12 are provided on the upper and lower surfaces of the capacitive element $C_0$, whereby a controlling inverter which is represented by switches $S_5$ and $S_6$ is connected to the electrode 12 of the upper surface, and one end of the coil $L_0$ is connected to the electrode of the lower surface. The coil is wound around the capacitive element $C_0$, and the other end of the coil $L_0$ is grounded, whereby the coil $L_0$ and the capacitive element $C_0$ form a series resonance circuit. The solution according to the figure intensifies the oscillation by utilizing the magnetic field of the coil in the generation of oscillations, too. Furthermore, the device is small in size since the elements can be positioned one upon the other.

Even if the invention has been described above with reference to some specific examples, it is to be understood that the invention is not restricted thereto but it can be modified within the inventive idea disclosed in the attached claims.

I claim:

1. A method of simultaneously generating heat by a magnetic induction field and mechanical oscillations, comprising the steps of:

forming a resonant circuit comprising a series connection of an inductive element and a piezoelectric capacitive element, wherein at least said piezoelectric capacitive element produces mechanical oscillations in response to an applied alternating current;

energizing said resonant circuit with an alternating current;

exposing a workpiece to electromagnetic energy developed by said inductive element for induction heating thereof; and using mechanical oscillations developed by at least said piezoelectric capactive element to oscillate said workpiece.

2. A method of claim 1, wherein said inductive element contains a magnetostrictive core, and said core also produces said mechanical oscillations.

3. A device of simultaneously generating heat by a magnetic induction field and mechanical oscillations, comprising:

a resonant circuit comprising a series connection of an inductive element used for induction heating of a workpiece exposed to electromagnetic energy developed by said inductive element and piezoelectric capacitive element used for producing mechanical oscillations to oscillate said workpiece; and means connnected to one end of said resonant circuit for energizing said resonant circuit with alternating current to cause said inductive element and said piezoelectric capacitive element to develope said electromagnetic energy and said mechanical oscillations respectively.

4. A device according to claim 3, wherein said inductive element contains a magnetostrictive core, and said core also produces said mechanical oscillations.

5. A device according to claim 3, wherein the capacitive element is made of piezoceramic magnetostrictive material and the coil of said inductive element is wound around said capacitive element.

6. A process for preheating and vulcanizing an electrical cable comprising a metal conductor surrounded by a vulcanizable insulator using a resonant circuit comprising an inductive element and a piezoelectric capacitive element in series with each other, comprising the steps of:

applying an alternating current to the resonant circuit to cause said inductive element to develop an induction field and the piezoelectric capacitive element to mechanically oscillate; and preheating the metal conductor by exposing the conductor to said inductive field of said inductive element and vulcanizing the insulator by applying to the insulator mechanical oscillations developed by said piezoelectric capacitive element.

7. A process for reducing friction caused by the drawing stones in a drawing and annealing device for cables and for softening a conductor hardened in a stone rack of said device, using a resonant circuit comprising an inductive element and a piezoelectric capacitive element in series with each other, comprising the steps of:

applying an alternating current to the resonant circuit to cause said induction element to develop an induction field and the piezoelectric capacitive element to mechanically oscillate;

reducing the friction by applying to the stone rack mechanical oscillations developed by said piezoelectric capacitive element; and softening the conductor after it has gone through the stone rack by exposing said conductor to said inductive field of said inductive element.

* * * * *